United States Patent [19]

Coughlin et al.

[11] Patent Number: 4,764,722
[45] Date of Patent: Aug. 16, 1988

[54] COAXIAL PROBE

[75] Inventors: Charles P. Coughlin, Chelsea; Robert H. Cadwallader, Poughkeepsie; Robert J. Celestino, Newburgh, all of N.Y.

[73] Assignee: International Business Machines Corporation, Armonk, N.Y.

[21] Appl. No.: 792,335

[22] Filed: Oct. 28, 1985

[51] Int. Cl.$^4$ ............................................. G01R 1/067
[52] U.S. Cl. ................................ 324/158 P; 324/72.5; 439/482
[58] Field of Search .................. 324/72.5, 149, 158 P; 339/108 R, 108 TP, 151 B

[56] References Cited

U.S. PATENT DOCUMENTS

| | | | |
|---|---|---|---|
| 2,617,853 | 11/1952 | Gilmer | 324/149 X |
| 3,731,191 | 5/1973 | Bullard et al. | 324/158 F |
| 4,423,373 | 12/1983 | LeCroy, Jr. | 324/72.5 |
| 4,477,774 | 10/1984 | Revireux | 324/72.5 X |

FOREIGN PATENT DOCUMENTS

| | | | |
|---|---|---|---|
| 481546 | 1/1976 | U.S.S.R. | 324/72.5 |
| 2086670 | 5/1982 | U.S.S.R. | |

OTHER PUBLICATIONS

Kurtz, "Probe and Probe Head for Tester", IBM Technical Disclosure Bulletin, vol. 9, No. 11, Apr. 1967, pp. 1507-1508.

Abbatecola et al., "A Coaxial Test Probe", IBM Technical Disclosure Bulletin, vol. 12, No. 7, Dec. 1969, pp. 1061-1062.

Lancaster, "Coaxial Circuit Probe", IBM Technical Disclosure Bulletin, vol. 12, No. 10, Mar. 1970, p. 1644.

IBM Tech. Discl. Bull., "Flex-Flat Cable Space Transformer for Multipin Systems", vol. 16, No. 8, Jan. 1974, pp. 2726-2727.

IBM Tech. Discl. Bull., Perlmann et al., "AC Space Transformer for Multipin Systems", vol. 16, No. 8, Jan. 1974, pp. 2724-2725.

Primary Examiner—Reinhard J. Eisenzopf
Assistant Examiner—Stephen M. Baker
Attorney, Agent, or Firm—Sughrue, Mion, Zinn, Macpeak and Seas

[57] ABSTRACT

A coaxial test probe employs a flexible inner conductor that buckles upon the application of an axial load is housed within a conductive outer sheath. The inner probe includes an insulating spacer which forms a recess applied to the protruding end of the inner conductor, such that buckling occurs within recess. A plurality of adjacent probes are mounted on a test fixture at opposing angles to facilitate automatic interrogation of closely spaced contact pads.

5 Claims, 1 Drawing Sheet

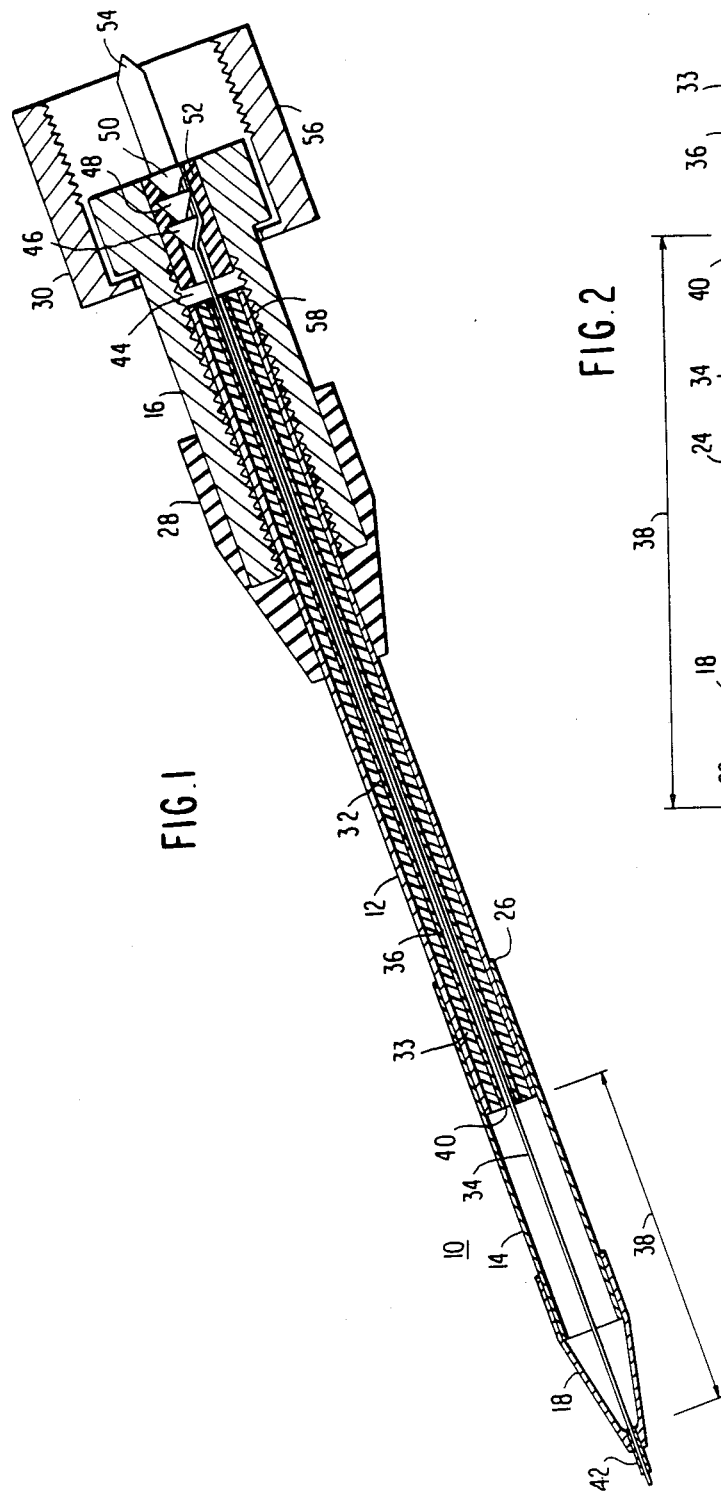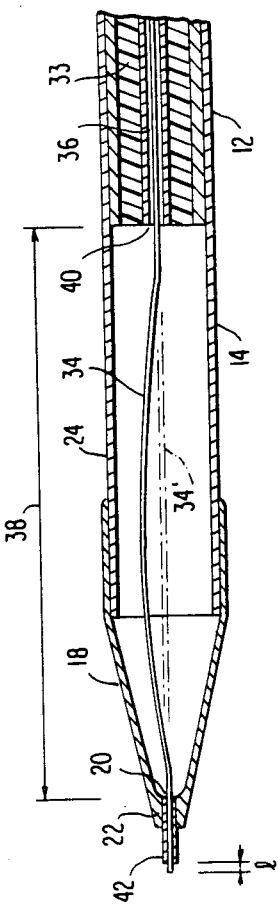

COAXIAL PROBE

BACKGROUND OF THE INVENTION

This invention relates to an electrical test probe and, in particular, to a probe which is employed in conjunction with the testing of semiconductor chip microsockets. As the size of integrated circuitry chips is reduced, package density increases, thereby reducing the area which probes may have as a target. Moreover, a reduction in device size increases the propensity toward damage of the contacts. Consequently, there exists a continuing requirement in the testing of integrated circuit technology for a test probe system which provides for verifiable contacts on small chip attachment pads, yet not requiring manual or optical alignment. Moreover, given the overall size in the devices under test, it is important that the total allowable positional system error be maximized to an acceptable level to eliminate the need for operator intervention or manual adjustment to accurately position probes on the pads under test.

Within the prior art, a variety of test devices have been proposed to perform different functions. These can broadly be classified as a defect analysis tester which utilizes two single point probes, a parametric resistance unit employing two bifuracted probes, a parametric capacitance unit which employs a shielded capacitance probe and a system for capacitance discharge short repairs which employs two single needle probes. Heretofore, none have been capable of performing multiple functions. The prior art is replete with examples of these various systems. U.S. Pat. No. 3,444,465 is a probe for graphic communications and utilizes a ballpoint pen-like refill as a center probe. A single centering spring is loaded with an outer shielding to eliminate shunt capacitance. The overall size of the system, and in particular that of the writing point 12, makes it generally inapplicable for use in testing chip microsockets. However, the use of a centering spring to provide loaded axial motion of the center probe is a design consideration in the development of test devices for use on fragile structures.

Another example of a spring loaded plunger single point contact system is found in U.S. Pat. No. 3,562,643. This device also employs a springloaded movement in conjunction with a flexing tip. Other examples are found in U.S. Pat. No. 4,423,373 and IBM Technical Disclosure Bulletin Vol. 21, No. 9, p. 3742, February 1979. U.S. Pat. No. 4,423,373 employs a coaxial center probe which is compression spring loaded. By utilizing dual contacts and having axial movement so biased, contact verification is possible. A somewhat different spring-loaded system is found in the IBM Technical Disclosure Bulletin wherein inner and outer coaxial probes are each independently spring loaded.

A plurality of conical point spring-loaded single contacts are disclosed in U.S. Pat. No. 4,164,704. The device therein is a test fixture for use in circuit boards with a test probe having a conductive spring and conductive contact cap which are slidably mounted between a fixed probe board member and plastic sheet used to urge the card under test to the probes.

A somewhat different arrangement is disclosed in U.S. Pat. No. 3,826,981 which employs a single probe which is fixed with an outer shield grounded. This probe allows for capacitance measurements to be made when the outer contact acts as a shield.

Examples of probes which may be clustered are disclosed in U.S. Pat. No. 4,209,742 and in commercial devices made by Pylon, the POGO series of probes, and those manufactured by Micromanipulator.

A significant shortcoming of these prior art devices is that they require precise manual alignment in the case of bifurcated probes in the range of 0.005 inch diameter in the case of very small chip microsockets. Test probes which utilize two needles having points in close proximity, such as 0.001 inch each utilize as a target approximately one half of the diameter of the microsocket pad. If the diameter is in the range of 0.005 inch, the total allowable system error is therefore ±0.002 inch. As can be appreciated, the allowable system error with these product devices is extremely small. Thus, discrete probes suffer from serious disadvantages. When testing semiconductor ship microsockets these problems are significant.

SUMMARY OF THE INVENTION

Given the deficiencies of the prior art, this invention departs significantly from other known test units by employing a different technique of supporting and loading the probe. Specifically, a buckling beam is contained within a hypodermic-type outer tube. Thus, the invention is a coaxial-type probe and more specifically one wherein the coaxial center probe operates on the buckling beam principle. Buckling beam elements per se are disclosed in U.S. Pat. No. 3,806,801. In theory, an array of beams having a length which is many times their individual crosssection allows for deflection or buckling when a predetermined axial load is applied. This technique is unique to testing an array of pads having heights that vary such that by relying on deflection of the beams the same force is exerted on each of the pads, irrespective of the degree of deflection.

The prior art devices utilizing buckling beam theory cluster a number of beams on a test fixture for simultaneous interrogation of a number of pads. The concept is to test pads that may have different heights without varying the input load, that is, to have buckling compensate for differences in height.

The buckling beam array is typically employed to test for shorts and opens over literally thousands of points. However, due to target contamination, misalignment or the like, an indication of a short or open may be an invalid reading. Thus, the array is used as a screening tool and single probes are subsequently used to verify that a defect in fact exists.

This invention departs from the buckling beam application and prior application by providing a coaxial test probe having a single flexible inner conductor of the buckling beam-type with an insulating coating positioned inside a conductive outer sheath. A recess is formed at the lower portion of the probe to provide sufficient space to allow the inner conductor to buckle when an axial load is applied to its protruding end. Buckling of the center probe limits the force exerted on the contact pad of the device being tested. Automatic positioning is achieved by maximizing the allowable test system position error. Adjacent probes are mounted at opposing angles, thereby allowing closely spaced adjacent contact pads to be interrogated. By increasing the maximum allowable positional error, this invention premits automatic probe positioning without a requirement of operator intervention or manual adjustment to position probes on the pads.

The probe of this invention may also function as a capacitance probe by employing the outer sheath contact as a shield for the inner conductor. The device may alternatively be used for capacitance discharge shorts repair since the buckling beam inner conductor has less inductive effect than prior probes which employ compression springs to control probe force. That is, in accordance with this invention, the contact force of the center contact is a function of buckling as opposed to a compression spring. For capacitance discharge shorts repair, energy pulse is critical and inductive reactance effects of a compression spring can impact this pulse configuration. Consequently, the probe of this invention allows for a multitude of utilizations such as the "Kelvin" bridge measurements and parametric resistance measurements in addition to the aforementioned use as a capacitance probe with the outer contact "opened" to form a shield for the inner probe, or as a device used to burn out internal shorts. Kelvin measurements employ commercially available equipment to determine resistance values with extreme accuracy.

This invention will be described in greater detail by referring to the attached drawings and the description of the preferred embodiment which follows.

BRIEF DESCRIPTION OF THE DRAWINGS

FIG. 1 is a sectional schematic of the coaxial test probe in accordance with this invention; and FIG. 2 is a sectional view of the tip portion illustrating buckling of the beam.

DESCRIPTION OF THE PREFERRED EMBODIMENT

Referring now to FIG. 1, the probe 10 comprises an elongated coaxial cable body 12 having at a lower end a tip portion 14 and at an upper portion a connector element 16. The lower end 14 comprises a metallic probe tip 18 which is hollowed and tapered. As illustrated in FIG. 2, the lower portion has a radius or chamfer 20 and a center coaxial throughhole 22. The probe tip is preferably stainless steel.

The lower end 14 comprises a cylindrical metallic sleeve element 24 defining a weldment between the tip portion 18 and the coaxial cable 12. This rigid cylinder 24 has the tip 18 press fitted onto it at one end and is silver soldered at the joint 26 with the coaxial cable. The coaxial cable is itself semirigid and utilizes an outer sheath 36 of stainless steel. At the upper portion, a connector such as a Microtech Part No. BP-50-1 is employed to provide a coaxial connection between the coaxial outer cable 12 and the central inner conductor 34. The connector has a boot portion 28 which may be metallic or made of an elastomer in the coaxial connector portion 30.

In accordance with this invention, an inner coaxial cable 32 is disposed in the central portion of the probe having typically a center conductor 34 having a thin polyimide insulative coating and housed within 0.010 inch ID tubing 32. The remainder of the central portion is filled with an insulator 33. The polyimide coating (not illustrated) and the insulator 33 isolate the conductive beam 34 from the sheath i.e. body 12 and tip portion 18. The sheath portion 36 of the conductor 34 is stripped away in the buckling beam zone 38. The buckling beam zone extends from the lower chamfer portion 20 of the probe tip to the portion of the coaxial cable 32 which does not have the outer sheath striped away. Typically, to define a point contact, the sheath 36 is stripped away at that location 40 where the outer coaxial cable 12 terminates within the rigid weldment 14. The distance 38 is therefore the effective buckle length of the center probe 34.

As illustrated in FIG. 2, the center probe 34 extends through the coaxial opening 22 and protrudes a distance (1) beyond the outer extension allowed, that is, a tip 42 extending outward from the probe tip. The tip 42 is preferably a rigid tube coupled in the coaxial bore 22. It may alternatively be an extension of the probe tip 18. Typically, the protrusion of the center probe 34, "1", is in the range of 0.007 inch.

At the connector end of the probe, the sheath 36 is stripped away and creating a void 44 between the end of the sheath and a bushing 52. The center probe 34 extends through the void 44 and is then interleaved around a plurality of connecting grooves 46, 48, and 50. Those locking elements are disposed in the plastic bushing 52 and terminate in the conductive coaxial connector element 54. An outer nut 56 is provided in a conventional manner to lock the male portion 54 of the coaxial terminal into its compatible coupling, typically screwed into place.

This invention provides a series of internal threads 58 to allow for threaded adjustment of the inner coaxial member 32. By thread rotation, the inner coaxial member 32 which is fixed to inner sleeve 52 moves that assembly relative to the outer housing 12 and 16. This slight relative a movement accomplishes two results. First, the outer end of the probe tends to wear, such that the distance "1" tends to steadily decrease. Axial movement toward the probe tip therefore maintains a uniform protrusion length. Secondly, as the probe tends to wear, the exposed buckling beam portion 34 reduces its free length. Thus, the degree of buckle illustrated in FIG. 2 departing from the dotted line 34' will not be uniform. Therefore, by suitably adjusting the length of the conductor adjustments in length occur to provide for suitable buckling action.

In operation, a plurality of probes are simultaneously utilized, each oriented approximately 12.5° from a vertical center line perpendicular to the surface of the substrate under test. Typically, contact pads are 0.005 inch in diameter, located on 0.010 inch centers. The protruding center portion is typically an insulative coated BeCu wire of 0.0035 inch in diameter such that as the probe contacts the contact pad under test, it retracks and buckles in the buckling zone 38 as illustrated in FIG. 2. Contact verification is made by determining continuity between tip 42, beam 34 and across the contact pad. This produces a desired contact force, approximately 30 grams, irrespective of differences in height of the pad under test. That is, the beam will buckle instead of increasing the force applied to the pad. Then, by utilizing separate elements, separate contact resistance and internal net resistance measurements can be accomplished after the probes are positioned. Such point-to-point testing verifies the existence of a defect in the net or determine that continuity exists. Parametric resistance measurements are made following contact by determining separate contact resistance from total resistance to determine internal net resistance. The conductive net length is known so resistance per unit length can ascertained to determine parametric resistance.

The same device can be used as a capacitance probe when, after contact verification occurs, the outer sheath formed by the probe tip element 18 is "opened", thereby acting as a shield for the inner conductor 34. Measurements are then made using a capacitance bridge.

Another mode of operation is in the capacitive discharge shorts repair which is a controlled electrical pulse employed to burn out internal shorts. Given the fact that there is no compression spring but rather uniform force is achieved by buckling beam action, the center contact has less inductive effects than prior art devices. Consequently, a controlled electrical pulse can be employed to optimize energy to burn out internal shorts in chip wiring repair.

Prior art techniques employed two single needle probes for this function, which can now be accomplished by the use of a single device. Consequently, the coaxial probe of this invention allows for defect analysis detection which previously required two single point probes, as well as parametric resistance measurements, parametric capacitance and shorts removal which previously required two bifurcated probes. One single device, therefore, replaces four prior probes.

It is apparent that the coaxial probe of this invention may be modified without departing from the essential scope of this invention.

We claim:

1. An electrical test probe comprising:
   an outer conductive sheath;
   a flexible inner conductor positioned coaxially within the outer sheath, said inner conductor having an insulating outer coating and an exposed inner conductive portion at one end, the other end being fixed said exposed inner conductive portion having a tip protruding through one end of said outer conductive sheath; and
   a hollow zone inside said outer conductive sheath having sufficient radial separation to permit lateral deflection of said inner conductor when an axial force is applied to said protruding tip without contacting an inner wall of said outer conductive sheath whereby the contact force exerted by said tip is entirely limited by the lateral deflection of said inner conductor.

2. The probe of claim 1, further comprising a hollow conductive tip portion coupled to said outer conductive sheath, said hollow conductive tip portion having an axial bore for the protruding tip of said exposed inner conductive portion to pass through.

3. The probe of claim 2, further comprising means extending from said axial bore to support the protruding tip of the exposed portion of said inner conductor.

4. The probe of claim 1, further comprising means for varying the length of said protruding tip of said exposed portion of inner conductor.

5. The probe of claim 4 wherein said means for varying the length of said protruding tip comprises a threaded internal terminal coupled to said inner conductor, threaded outer annular jacket coupled to said outer conductive sheath wherein rotation of said outer jacket moves said internal terminal relative to said outer conductive sheath.

* * * * *